United States Patent [19]

Etherington et al.

[11] 3,860,881

[45] Jan. 14, 1975

[54] RADIO FREQUENCY AMPLIFIER

[75] Inventors: Ralph Etherington; Henry W. Riviere, both of Lynchburg, Va.

[73] Assignee: General Electric Company, Lynchburg, Va.

[22] Filed: Sept. 12, 1973

[21] Appl. No.: 396,350

[52] U.S. Cl. ........................ 330/21, 325/105, 330/31

[51] Int. Cl. ............................................... H03f 3/04

[58] Field of Search ...... 325/123, 124, 105; 330/21, 330/31, 165, 188, 195

[56] References Cited

UNITED STATES PATENTS 3,209,274 9/1965 Spaulding ............................ 330/21

*Primary Examiner*—Alfred E. Smith
*Assistant Examiner*—Lawrence J. Dahl

[57] ABSTRACT

The base circuit of a radio frequency power amplifier transistor is loaded with a circuit comprising part of a matching transformer and a parallel circuit having a resistor, an inductor, and a capacitor connected to the transformer. This loading circuit is connected between the base matching network of the transistor and the common or ground terminal of the power amplifier. The loading circuit eliminates the generation of frequencies below the main radio frequency applied to and amplified by the power amplifier.

1 Claim, 1 Drawing Figure

PATENTED JAN 14 1975 3,860,881
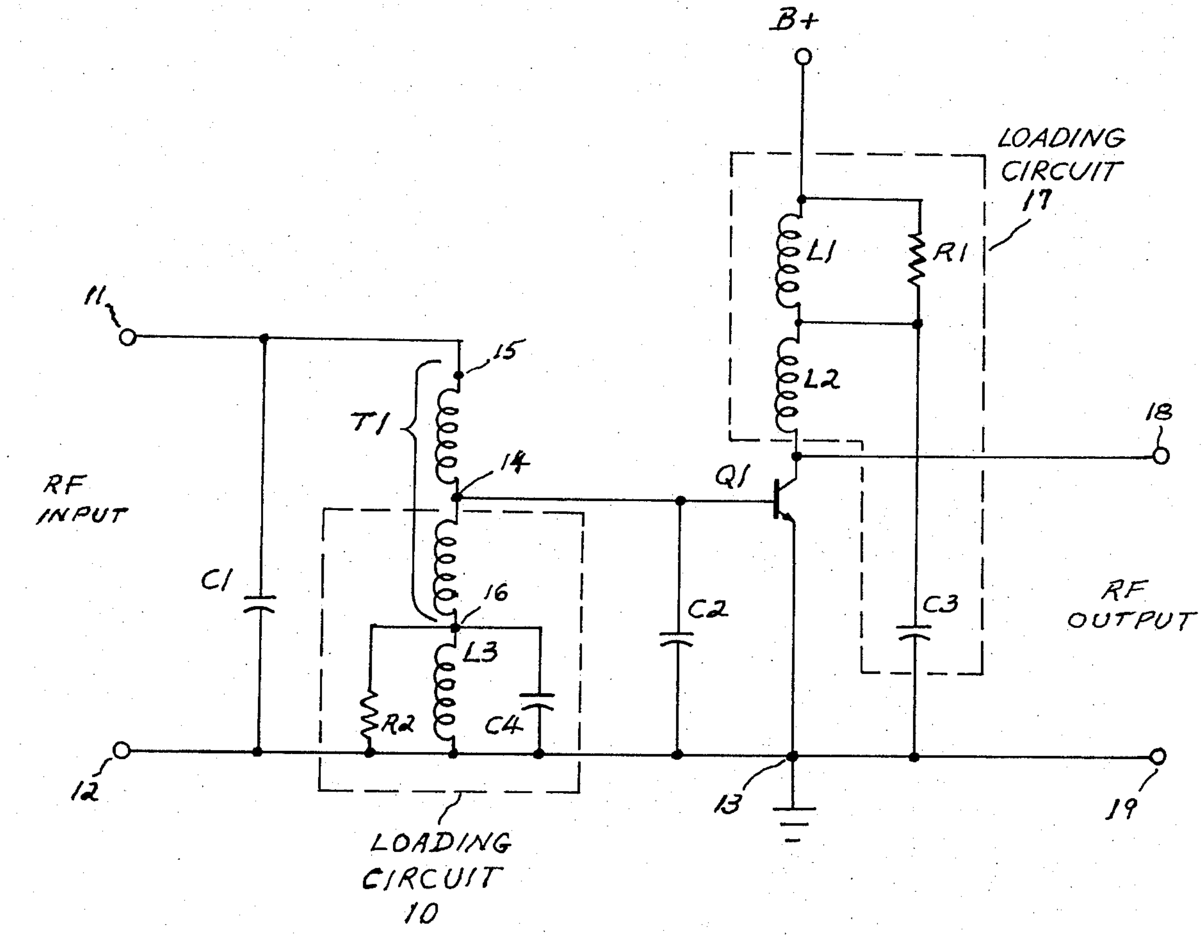

RADIO FREQUENCY AMPLIFIER

BACKGROUND OF THE INVENTION

Our invention relates to a radio frequency power amplifier, and particularly to a new and improved loading circuit for eliminating the generation of undesired frequencies below the main radio frequency amplified by the power amplifier.

Radio frequency power amplifiers using a transistor tend to generate oscillations at frequencies below the main radio frequency at which the power amplifier operates. Previously, a loading circuit has been provided at the collector of the transistor, and this loading circuit has reduced low frequency oscillations to some extent, but not completely. Where the radio frequency power amplifier is to be connected to an antenna, as is usually the case, such low frequency oscillations are undesirable and in many instances totally unacceptable.

Accordingly, a primary object of our invention is to provide a transistorized radio frequency power amplifier that produces no low frequency oscillations.

Another object of our invention is to provide a new and improved loading circuit for the base circuit of a transistor in a radio frequency power amplifier.

SUMMARY OF THE INVENTION

Briefly, these and other objects are achieved in accordance with out our by a loading circuit connected between the input impedance matching network for the base of the transistor and the common or ground terminal of the radio frequency power amplifier. This loading circuit comprises part of the impedance matching network and a parallel circuit having a resistor, an inductor, and a capacitor connected to the network. The resistor magnitude is chosen to provide a low damping impedance to the low frequency oscillations below the main frequency being amplified. The capacitor is chosen to provide a low impedance at the main frequency being amplified between the base matching network and the common terminal. And the inductor is chosen to provide a low resistance direct current path from the base matching network to the common terminal. With this loading circuit, we have found that the lower frequency oscillations are eliminated, particularly if a loading circuit is also used in the collector circuit of the transistor.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which the single figure illustrates an electrical diagram of a preferred embodiment of our loading circuit as used with a transistorized radio frequency power amplifier.

DESCRIPTION OF THE PREFERRED EMBODIMENT

In the single figure, we have shown a radio frequency power amplifier having a loading circuit 10, shown enclosed in dashed lines, in accordance with our invention. Before describing our loading circuit 10, we will first describe the radio frequency power amplifier. Signals to be amplified are applied to input terminals 11, 12. As an example, we have assumed that these signals occupy a band having a center frequency of 150 megahertz and are supplied by a line or other device having an impedance of 50 ohms. A capacitor C1 is connected between the terminals 11, 12 as part of the input impedance matching. The input terminal 12 is connected to a point of reference potential or ground at bus 13. An impedance matching transformer T1 having a center tap 14 is provided. One end 15 of this transformer T1 is connected to the input terminal 11, and the other end 16 is connected in our loading circuit 10. The transformer tap 14 is connected to the base of the power amplifier transistor Q1, which we have assumed to be of the NPN type. A capacitor C2 is connected between the base and the reference bus 13. Power for the transistor Q1 is supplied from a suitable source of direct current potential which would have its positive terminal connected to a B+ terminal and its negative terminal connected to the bus 13. The B+ terminal is connected through a collector loading circuit 17 to the collector of the transistor Q1. The loading circuit 17 comprises two serially connected inductors L1, L2. A resistor R1 is connected in parallel with the inductor L1, and the junction of the inductor L1 and the inductor L2 is connected to the bus 13 by a capacitor C3. Amplified output signals are derived at output terminals 18, 19 which are respectively connected to the collector of the transistor Q1 and the bus 13. These signals may be applied to any suitable network for utilization or further amplification.

The circuit as described thus far is known in the art, and in the example assumed, provides amplification for the RF input signals of 150 megahertz. In addition, the transformer T1, through its tap 14, provides an impedance transformation of 4 to 1 so that the base of the transistor Q1 is connected to the proper impedance. In the assumed example, this impedance is approximately 12.5 ohms. Thus, the transformer T1 provides an impedance transformation of 50:12.5. The circuit as described thus far provides good amplification. However, we have found that despite the collector loading circuit 17, the amplifier still tends to produce lower frequency oscillations, for example 75 megahertz, 37.5 megahertz, and 18.75 megahertz in addition to amplifying the main frequency of 150 megahertz. These low frequencies are passed to the output circuit and may be radiated. Such radiations are undesirable, and in many applications may be totally unacceptable. Accordingly, it is necessary that the low frequency oscillations be eliminated.

In accordance with our invention, we provide the loading circuit 10 as shown in the figure to eliminate these low frequency oscillations. Our loading circuit 10 comprises the inductance of the transformer T1 between the tap 14 and the end 16. Our circuit 10 further comprises a resistor R2, an inductor L3, and a capacitor C4 connected in parallel between the end 16 of the transformer T1 and the bus 13. The resistor R2 has a low magnitude, for example 51 ohms, so that at the lower frequencies where undesired oscillations tend to be produced, the base of the transistor Q1 sees the relatively low impedance provided by the resistor R2. This low impedance resistor R2 eliminates for all practical purposes the low frequency oscillations. The capacitor C4 is of a size, for example 56 picofarads, so that at the high frequencies at which the amplifier is intended to operate, namely 150 megahertz in the assumed example, the lower end 16 of the transformer T1 is or appears to be connected to the ground bus 13. The inductor L3 has a magnitude that presents a relatively high impedance to the low frequencies and main frequency but does provide a low impedance direct current path around the resistor R2. Thus, our loading circuit 10 provides a low impedance to those frequencies at which the oscillations previously tended to be produced, but provides the necessary direct current path and the necessary or desired impedance at the higher frequencies at which the amplifier is intended to operate. With such a loading circuit, we have found that the low frequency oscillations have been eliminated.

It will thus be seen that we have provided a new and improved loading circuit for reducing low frequency oscillations in a radio frequency power amplifier intended to operate at higher frequencies. While we have shown only one embodiment of our loading circuit with a radio frequency power amplifier, persons skilled in the art will appreciate that this embodiment may be modified. For example, our invention may be utilized with PNP type transistors, or may be utilized with different impedance transforming networks. Therefore, while our invention has been described with reference to only one embodiment, it is to be understood that modifications may be made without departing from the spirit of the invention or from the scope of the claims.

What we claim as new and desire to secure by Letters Patent of the United States is:

1. An improved radio frequency power amplifier comprising:

a. a pair of input terminals to which a band of radio frequency signals at a selected center frequency are applied for amplification;

b. an impedance matching transformer having a winding with a tap intermediate its first and second ends to provide first and second portions respectively having a predetermined impedance relation;

c. means connecting said first transformer end to one of said input terminals;

d. a common terminal;

e. means connecting said common terminal to the other of said input terminals;

f. a first capacitor connected between said one input terminal and said common terminal;

g. a power amplifier transistor having an emitter, a base, and a collector;

h. means connecting said transistor base to said transformer winding tap;

i. a second capacitor connected between said transistor base and said common terminal;

j. means connecting one end of the emitter-collector path of said transistor to said common terminal;

k. an output circuit connected to the other end of said emitter-collector path of said transistor;

l. and a low frequency loading circuit comprising:

1. said second portion of said impedance matching transformer;

2. a resistor, a capacitor, and an inductor connected in a parallel circuit;

3. means connecting said parallel circuit between said second transformer end and said common terminal;

4. said loading circuit capacitor providing a relatively low impedance at said frequency band, and providing a relatively high impedance at lower frequencies to be eliminated so as to cause said loading circuit resistor to load and reduce said low frequency oscillations.

* * * * *

UNITED STATES PATENT OFFICE
CERTIFICATE OF CORRECTION

PATENT NO. : 3,860,881

DATED : January 14, 1975

INVENTOR(S) : Ralph Etherington & Henry W. Riviere

It is certified that error appears in the above-identified patent and that said Letters Patent are hereby corrected as shown below:

Column 1, line 28 cancel "out our" and insert -- our invention --

Signed and Sealed this

*second* Day of *December 1975*

[SEAL]

*Attest:*

RUTH C. MASON
*Attesting Officer*

C. MARSHALL DANN
*Commissioner of Patents and Trademarks*